(12) United States Patent
Kawamura et al.

(10) Patent No.: US 6,686,729 B1
(45) Date of Patent: Feb. 3, 2004

(54) DC/DC SWITCHING REGULATOR HAVING REDUCED SWITCHING LOSS

(75) Inventors: J. Patrick Kawamura, Allen, TX (US); James L. Krug, Dallas, TX (US); David W. Evans, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/271,121

(22) Filed: Oct. 15, 2002

(51) Int. Cl.[7] .................................................. G05F 1/40
(52) U.S. Cl. ....................................................... 323/282
(58) Field of Search ................................. 323/265, 282, 323/283, 284, 287, 288, 351

(56) References Cited

U.S. PATENT DOCUMENTS

| | | |
|---|---|---|
| 3,691,537 A | 9/1972 | Burgess et al. |
| 3,955,181 A | 5/1976 | Raymond, Jr. |
| 4,030,083 A | 6/1977 | Boll |
| 4,070,653 A | 1/1978 | Rao et al. |
| 4,292,677 A | 9/1981 | Boll |
| 4,430,730 A | 2/1984 | Tien |
| 4,553,082 A * | 11/1985 | Nesler .......................... 323/288 |
| 4,727,308 A * | 2/1988 | Huljak et al. ................. 323/222 |
| 5,185,721 A | 2/1993 | Love et al. |
| 5,216,290 A | 6/1993 | Childers |
| 6,160,388 A * | 12/2000 | Skelton et al. ............... 323/282 |
| 6,469,481 B1 * | 10/2002 | Tateishi ........................ 323/282 |
| 6,492,793 B1 | 12/2002 | Bentolila et al. |
| 6,504,351 B2 * | 1/2003 | Eagar et al. .................. 323/282 |

* cited by examiner

*Primary Examiner*—Adolf D. Berhane
(74) *Attorney, Agent, or Firm*—William B. Kempler; W. James Brady, III; Frederick J. Telecky, Jr.

(57) ABSTRACT

A DC/DC switching regulator has a semiconductor switch coupled to an inductor, a first capacitor and a rectifier. A circuit to improve the switching efficiency of the semiconductor switch has a transmission gate coupled between the gate of the semiconductor switch and a second capacitor. The transmission gate is turned ON only when the gate of the semiconductor switch is about to make a positive or negative transition and isolated from the first and second voltage sources. A portion of the charge stored in the parasitic capacitance of the gate of the semiconductor switch can be stored in the second capacitor and reused to partially drive the semiconductor switch from the second to the first ON/OFF state. A further embodiment employs this technique with a synchronous rectifier in the regulator circuit.

20 Claims, 4 Drawing Sheets

US 6,686,729 B1

DC/DC SWITCHING REGULATOR HAVING REDUCED SWITCHING LOSS

BACKGROUND OF THE INVENTION

This invention relates to a DC/DC switching regulator and more specifically to a DC/DC switching regulator for low power applications, such as a cellular telephone.

DC/DC switching regulators are part of many power management systems because of the improved power conversion efficiency provided by these regulators over that of linear regulators or low-dropout linear regulators (LDO). Switching regulator designs can achieve efficiency as high as 80–90% compared with efficiencies 25–50% for a LDO. In modem power management systems, switching regulators are often utilized to perform the task of pre-regulating the power supply used by the LDO to produce an overall system efficiency of about 75%.

FIG. 1A shows a typical prior art buck (voltage reducing) DC/DC switching regulator. FIG. 1B shows a typical prior art voltage boost switching regulator. Both circuits have the same essential components including a feedback and control circuit 104, 154; a driver 106, 156; a switching transistor 108, 158; an inductor 112, 162; an output capacitor 116, 166; a rectifier 114, 164, such as a Schottky diode; and a feedback loop 118, 168. Circuits that perform both boost and buck are also known in the art (not shown). The operation of these circuits is well known in the art and need not be described in detail here. One of the components of the total power loss of the switching regulator is the power switch gate drive loss. Each of the switching transistors 108, 158 have an associated parasitic capacitance 110, 160 which is charged up from the power supply or boosted supply and discharged to ground. All of the power used to charge the gate of the MOSFET is lost when the parasitic capacitance is discharged to ground. The power loss can be expressed as $P_{sw} = C_g \cdot V_{in} \cdot f_s$ where $C_g$ is the parasitic gate capacitance, $V_{in}$ is the input voltage swing, of the switching transistor and $f_s$ is the switching frequency. The power switch, which can be internal or external to the integrated circuit, is typically very large having a width/length exceeding $50k\,\mu m$ having an associated parasitic gate capacitance in excess of 100 pF. Thus, the switching losses can be a significant portion of the overall losses in the switching regulator, especially at light loads.

In DRAM circuits it is common to drive the gate of a pass transistor to substantially above the array voltage supply level (Vdd) in order that the storage elements of the memory be charged to the full array supply voltage. U.S. Pat. Nos. 5,185,721 and 5,216,290 show circuits in which the capacitor utilized to generate the boost voltage is utilized to store the charge on the parasitic capacitor of the gate of the pass transistor when the gate is to be discharged to ground. See also U.S. Pat. Nos. 3,691,537; 4,030,083; 4,070,653; 4,292,677; and 4,430,730.

SUMMARY OF THE INVENTION

It is a general object of the present invention to improve the switching efficiency of a DC/DC switching regulator.

This and other objects are achieved, in accordance with one aspect of the invention by a voltage converter comprising a semiconductor switch coupled to an inductor, a first capacitor and a rectifier, the semiconductor switch having a gate and being driven between ON and OFF states from first and second voltage sources by a control circuit. A circuit for improving switching efficiency of the semiconductor switch includes a second capacitor and a first transmission gate coupled between the second capacitor and the gate of the semiconductor switch. The control circuit is coupled to the first transmission gate and generates a control signal to turn ON the first transmission gate when the first control circuit isolates the semiconductor switch from the first and second voltage sources, turns OFF the first transmission gate before the control circuit drives the semiconductor switch to a second one of the ON and OFF states, turns on the first transmission gate after the first control circuit isolates the semiconductor switch from the first and second voltage sources and turns OFF the first transmission gate before driving the semiconductor switch from the second of the ON and OFF states, to the first of the ON and OFF states. Thus, a portion of charge stored on a parasitic capacitance of the gate of the semiconductor switch is stored in the second capacitor and reused to partially drive the semiconductor switch from the first of the ON and OFF states to the second one of the ON and OFF states.

Another aspect of the invention includes a DC to DC converter for generating a voltage at an output which is lower than a voltage supplied at an input having a PMOS transistor coupled between the voltage supply and the series connection of an inductor and a capacitor, the voltage across the capacitor being the output voltage. A rectifier is connected in parallel to the series connected inductor and capacitor and a control circuit for the PMOS transistor is coupled to a gate thereof and provides a drive signal between substantially the supply voltage and substantially a reference voltage. A transmission gate is coupled between the gate, a second capacitor and the reference voltage and is responsive to a control voltage generated by the control circuit for driving the transmission gate ON after the gate of the PMOS transistor is isolated from the supply voltage and the reference voltage, driving the transmission gate OFF after a predetermined time interval and before the control circuit drives the gate of the PMOS transistor to substantially the supply voltage, the control circuit isolating the gate of the PMOS transistor before driving the transmission gate ON for a predetermined time interval before the drive signal at substantially the reference voltage is applied to the gate of the PMOS transistor.

A further aspect of the invention comprises a method for operating a voltage converter having a semiconductor switch coupled to an inductor, a first capacitor, and a rectifier, the semiconductor switch being driven between ON and OFF states from first and second voltage sources and having parasitic capacitance at a gate thereof. The semiconductor switch is isolated from the first and second voltage sources. Charge is transferred from the parasitic capacitor to a second capacitor coupled thereto. The charge transfer is terminated and the second capacitor isolated from a remainder of the voltage converter. A ON/OFF state of the semiconductor switch is changed by driving the gate to the other of the first and second voltage sources. The semiconductor switch is isolated from the first and second voltage sources. The second capacitor is coupled to the gate to charge the parasitic capacitor and decoupled prior to driving the semiconductor switch to the other of the ON/OFF states.

A still further aspect of the invention includes a cellular telephone having a voltage converter for powering a telephone circuit, the voltage converter comprising a semiconductor switch coupled to an inductor, a first capacitor and a rectifier, the semiconductor switch having a gate and being driven between ON and OFF states from first and second voltage sources by a control circuit. A second capacitor, a first transmission gate coupled between the second capacitor and the gate of the semiconductor switch, wherein the control circuit is coupled to the first transmission gate and generates a control signal to turn ON the first transmission gate when the control circuit isolates the semiconductor switch from the first and second voltage sources, turns OFF the first transmission gate before the control circuit drives the semiconductor switch to a second one of the ON and OFF states, turns on the first transmission gate after the first control circuit isolates the semiconductor switch from the first and second voltage sources and turns OFF the first transmission gate before driving the semiconductor switch from the second of the ON and OFF states to the first of the ON and OFF states. Thus, a portion of the charge stored on a parasitic capacitor of the gate of the semiconductor switch is stored in the second capacitor and reused to partially drive the semiconductor switch from the first of the ON and OFF states to the second one of the ON and OFF states.

DETAILED DESCRIPTION

Figure 1A:
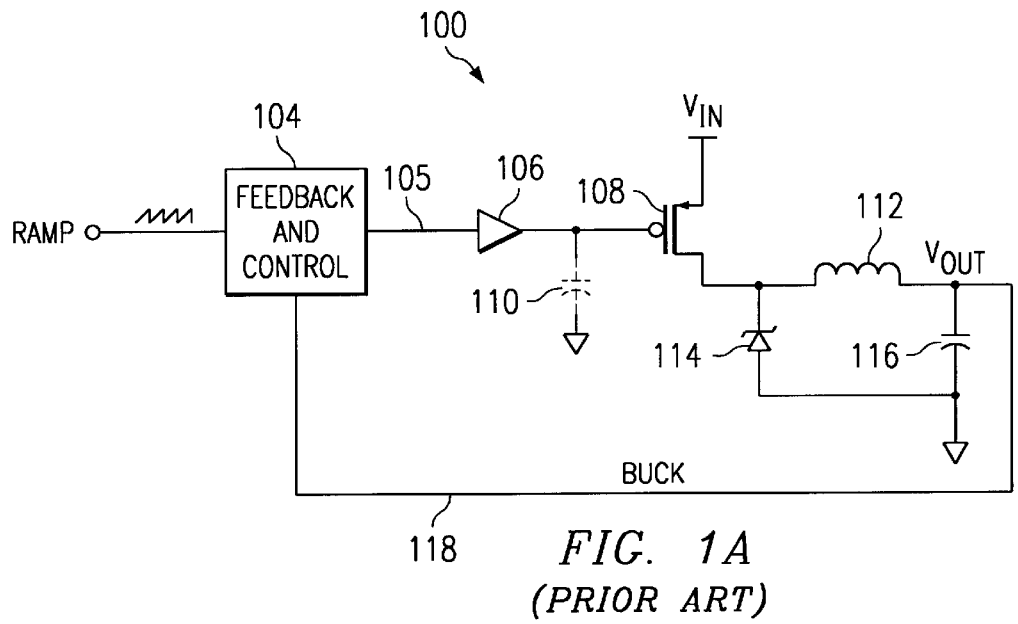
FIG. 1A is a schematic drawing of a prior art buck DC/DC switching regulator.
Figure 1B:
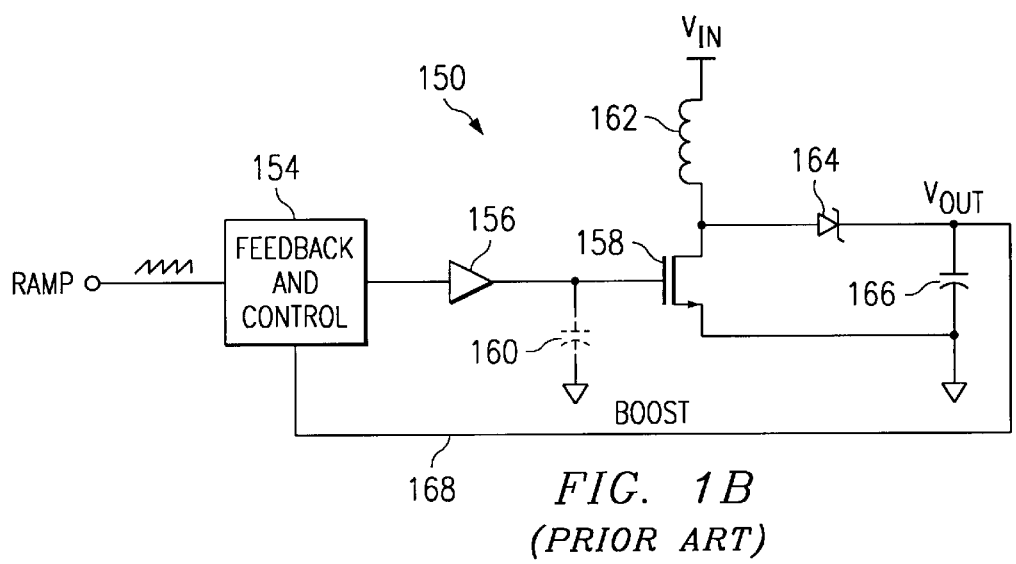
FIG. 1B is a schematic diagram of a prior art boost DC/DC switching regulator.
Figure 2:
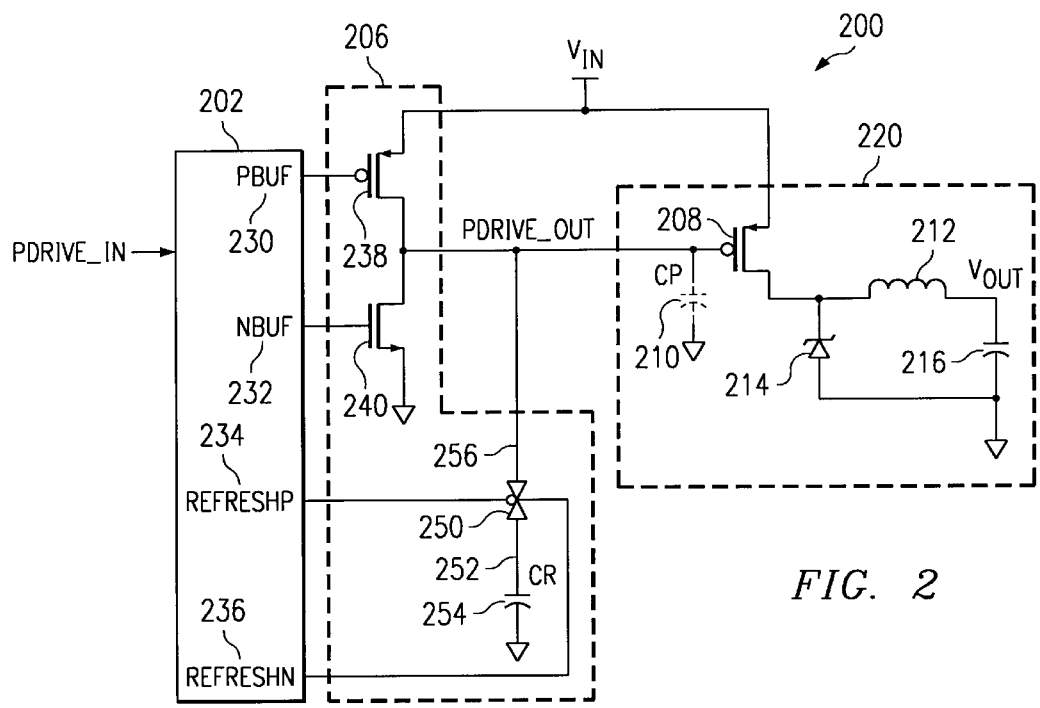
FIG. 2 is a schematic diagram of a buck DC/DC switching regulator according to the present invention.

Referring to FIG. 2, a schematic diagram of a buck DC/DC switching regulator (voltage converter) according to the present invention is generally shown as 2. This circuit is similar to the circuit 1 shown in FIG. 1A. In FIG. 2, elements also shown in FIG. 1 have similar reference numerals. In FIG. 2, the feedback loop 118 and the feedback and control circuitry 104 have been omitted for clarity. The signal PDRIVE_IN is the signal that would appear on signal 105 of the prior art circuit shown in FIG. 1A. This signal is generated in response to the feedback on line 118 and may be modified by other control features in the feedback control circuit 104. The driver circuit 206 corresponds to the buffer/driver 106 shown in FIG. 1A. The driver circuit 206 consists of PMOS transistor 238 coupled in series with an NMOS transistor 240 between the power supply Vin and ground. The signal PDRIVE_OUT is applied to the gate of switching transistor 208. When transistor 208 is to be driven OFF, transistor 238 is turned ON to drive to signal PDRIVE_OUT to the power supply voltage supply Vin less the voltage drop across transistor 238. When the gate of transistor 208 is driven high, the parasitic capacitance 210 will be charged toward the power supply voltage Vin. If transistor 238 is ON for a sufficient period of time, the parasitic capacitance 210 will be charged to the full supply voltage. NMOS transistor 240 is used to drive the gate of transistor 208 to ground to turn transistor 208 ON. When transistor 240 is made conductive, it discharges capacitor 210 to ground, and the charge stored thereon is lost.

In the embodiment shown in FIG. 2, the driver 206 contains additional circuitry for recovering a portion of the charge stored on parasitic capacitance 210. A transmission gate 250 is coupled between the gate of transistor 208 and a capacitor 254. The other electrode of capacitor of 254 is coupled to ground. When transmission gate 250 is ON, capacitors 210 and 254 are coupled in parallel. Thus, a portion of the charge stored on capacitor 210 will be transferred to capacitor 254 until the voltage across the parallel coupled capacitors 210 and 254 reach a value consistent with the law of conservation of charge, given sufficient time. When transmission gate 250 is turned ON at the time when capacitor 210 has been charged to the input voltage Vin, but before transistor 240 has been turned on to remove the charge away from capacitor 210, a portion of the charge on capacitor 210 can be saved on capacitor 254 for later reuse. After the charge has been redistributed between capacitors 210 and 254, the transmission gate 250 is turned OFF, causing the electrode 252 to store a portion of the charge on capacitor 210. Then the transistor 240 is turned ON in order to pull the gate of transistor 208 to ground potential less the voltage drop across transistor 240. When transistor 240 is turned ON, the remainder of the charge stored in capacitor 210 that has not been transferred to capacitor 254 is lost. However, a portion of the charge has still been saved on capacitor 254.

Figure 3:
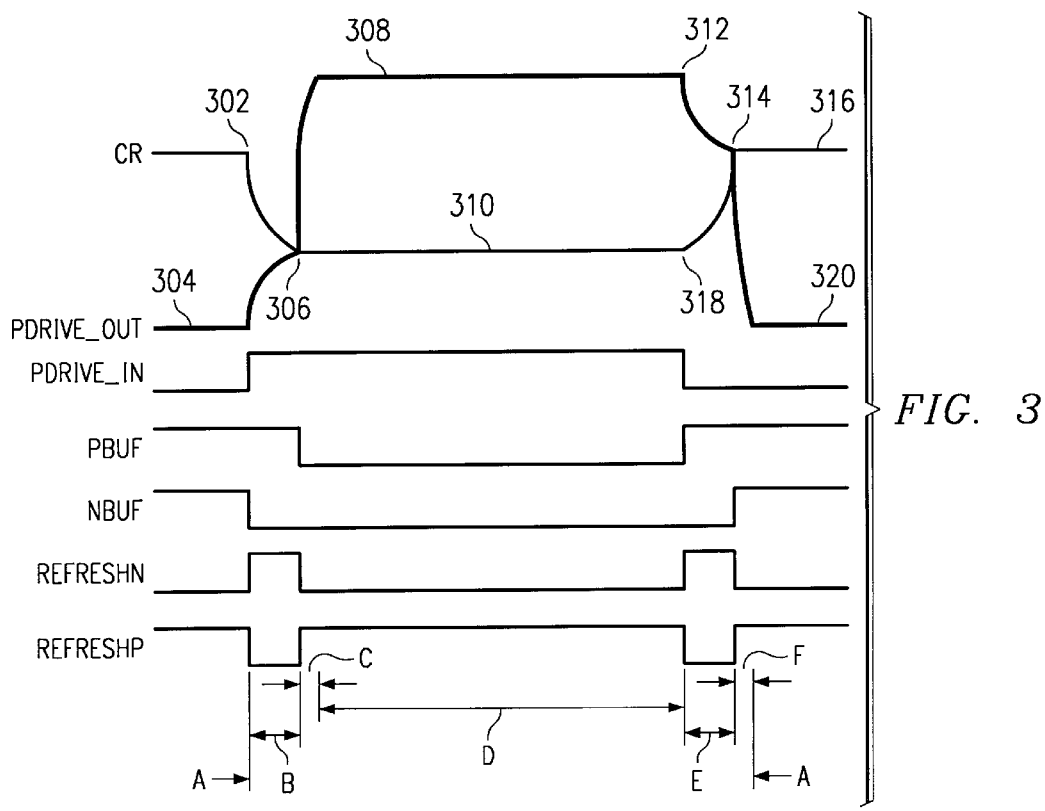
FIG. 3 is a timing diagram for the switching regulator of FIG. 2.

Circuit 202 is added to circuitry shown in FIG. 1A to provide the switching waveforms for the transistors 238, 240 and the transmission gate 250. The generation of these waveforms and the operation of the circuit will now be described in connection with FIG. 3. In FIG. 3, the events are defined by the time line at the bottom of the figure which are designated by appropriate letters. During period A, the input signal to circuit 202 PDRIVE_IN is low and the signal PDRIVE_OUT is also low. At this time, signals PBUF and NBUF are high coupling the gate of transistor 208 to ground through NMOS transistor 240 which renders transistor 208 conducting. The signal REFRESHN is low and the corresponding signal REFRESHP is high rendering transmission gate 250 OFF so that the storage capacitor 254 is separated from the signal PDRIVE_OUT. The charge on the capacitor 254, less any leakage current, is held and the voltage across it remains constant, since the ungrounded end of the capacitor at electrode 252 is essentially floating.

Time period B starts when the signal PDRIVE_IN rises. At the beginning of this time period, signal NBUF is pulled low, which turns OFF the NMOS pulldown transistor 240. At this time, in a conventional circuit as shown in FIG. 1A, the signal PDRIVE_OUT would be pulled up to the power supply voltage Vin through the PMOS pullup transistor 238. Instead, in the present invention, the signal REFRESHN is driven high and the signal REFRESHP is driven low to turn ON the transmission gate 250. This allows charge stored on the capacitor 254 (see below) to be shared between the capacitor 254 and the parasitic capacitance 210. As shown in FIG. 3, the signal CR drops from a level at 302 to a level at 306 while the signal PDRIVE_OUT rises from a point 304 to the same point 306. This occurs, given enough time in period B, for the two voltages to equal (neglecting the voltage drop across the transmission gate 250) at a magnitude determined by the capacitance of the two capacitors and the voltage across the storage capacitor 254.

At the end of period B, the signal REFRESHN is pulled low and the signal REFRESHP is pulled high which once again turns OFF the transmission gate 250 and separates the capacitor 254 from the signal PDRIVE_OUT. After the transmission gate 250 has been turned OFF, PBUF is pulled low, which turns on the PMOS pullup transistor 238 and connects PDRIVE_OUT to Vin. The time period C is the time during which the signal PDRIVE_OUT is pulled the rest of the way to Vin. In FIG. 3, the signal PDRIVE_OUT at 306 is equal to the voltage on the capacitor 254 starts at 306 and rises to level 308 (Vin). Transistor 208 is now OFF.

During period D, transistor 208 remains in the OFF state. It remains in the OFF state until the signal PDRIVE_IN falls, thus starting the time period E. As soon as PDRIVE_IN falls, PBUF is driven high, turning OFF the PMOS pullup transistor 238 and separating PDRIVE_OUT from the supply voltage Vin. After the signal PBUF rises, the signal REFRESHN rises and the signal REFRESHP falls again, turning ON the transmission gate 250 and coupling the capacitor storage node 252 to PDRIVE_OUT. The voltage on PDRIVE_OUT is now higher than that on the parasitic capacitor 254 and the parasitic capacitor 210 discharges into capacitor 254. In FIG. 3, the signal PDRIVE_OUT drops at point 312 to point 314 while the voltage CR of the capacitor 210 rises from point 318 to point 314. If the time period E is long enough, the two voltages will equal out at a magnitude determined by the law of conservation of charge. The parasitic capacitance 254 is now charged and ready for the time period B again. As in the beginning of time period C, at the end of a delay, the signal REFRESHN is pulled low and REFRESHP is pulled high, again separating the capacitor node 252 from the signal PDRIVE_OUT. Once the transmission gate 250 has been turned OFF, the signal NBUF is pulled high turning ON the NMOS pulldown transistor 240 and connecting PDRIVE_OUT to ground. The time period F is the time during which the signal PDRIVE_OUT is pulled the remainder of the way to ground. In FIG. 3 this is the transition of PDRIVE_OUT from 314 to ground potential at 320. It should be noted that the capacitor 254 stays at a value 316, which is essentially the same as the value 302 from which the process started. Time period A follows again during which the signal PDRIVE_OUT is low and before the signal PDRIVE_IN rises.

It should be noted that in the prior art techniques, there is no time period B. Time periods C and D follow immediately after time period A. In addition, there is no time period E. Time periods F and A follow immediately after time period D.

Figure 4:
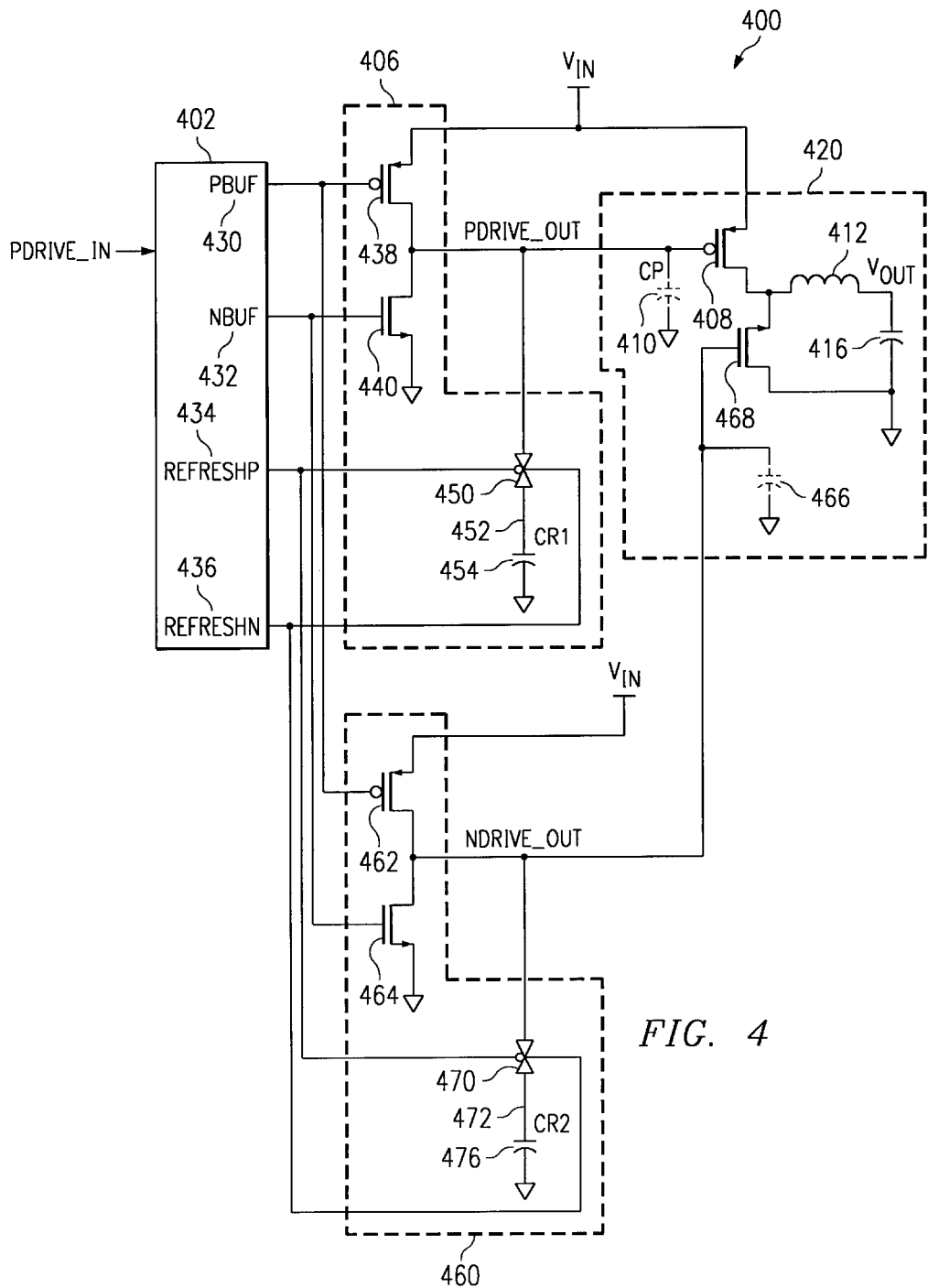
FIG. 4 is a schematic diagram of a buck DC/DC switching regulator having a synchronous rectifier.

It is well know in the art that the efficiency of a DC/DC switching regulator can be improved by replacing the rectifier diode 114, 164 or 214 with a synchronous rectifier. The voltage drop across the synchronous rectifier can be made much smaller than the voltage drop across the rectifier diode. FIG. 4 shows alternate embodiment of the circuit of FIG. 2 in which the rectifier diode has been replaced by a synchronous rectifier. The circuit, generally shown as 4, is identical to the circuit shown in FIG. 2 except for the synchronous rectifier transistor 468 and its associated drive circuitry. In FIG. 4, like components to FIG. 2 have similar reference numerals. The synchronous rectifier transistor 468 is chosen as NMOS transistor because it is being switched to ground. However, it should be noted that, depending upon the circuit in which it is used, a PMOS device may be more appropriate. The gate of transistor 468 has an associated parasitic capacitance shown by capacitor 466. The gate is coupled to a line NDRIVE_OUT which is at the juncture of PMOS transistor 462 and NMOS transistor 464 which are coupled between the input supply Vin and ground. Also coupled to this node is a transmission gate 470 and a storage capacitor 476. One electrode 472 of the storage capacitor is coupled to the transmission gate 470 and the other electrode is coupled to ground. The gate of PMOS transistor 462 is coupled to the signal PBUF and the gate of NMOS transistor 464 is coupled to the signal NBUF. The transmission gate is coupled to the signal REFRESHP and REFRESHN. These signals are generated by a signal generator circuit 402 which is identical to the circuit 202 in FIG. 2.

As well known to those skilled in the art, when transistor 408 is shut OFF, the inductor 412 will try to maintain the current flow and the refore will generate a voltage which is the inverse of the voltage generated when the transistor 408 is on. It is common to use a diode such as diode 114 and 214 to allow this energy to charge the capacitor 116, 216 or 416 as the magnetic field of the inductor collapses. A synchronous rectifier transistor, such as transistor 468, allows the current to flow with a lower voltage drop than can be produced by the diode 114, 214 which improves the efficiency of the converter. Because transistor 468 has been chosen to be an NMOS transistor and transistor 408 has been chosen to be a PMOS transistor, then the control voltage waveforms can look the same. This allows the circuit 460 to be driven by the circuit 402 which also drives circuit 406, thus saving the need for additional drive circuitry. The signal NDRIVE_OUT will be the same as PDRIVE_OUT but will have the opposite effect. Thus, in time period A of FIG. 3, the gate voltage on both transistor 408 and transistor 468 is at a low voltage shown at 304, when transistor 408 is conducting and transitor 468 is nonconducting. As the voltage of the gate of transistor 408 rises from 304 to 306 to 308, thus turning transistor 408 OFF, the voltage on the control gate of transistor 468 will rise from 304 to 306 to 308, thus turning transistor 468 ON. During the time interval B, the transmission gate 470 is turned ON by driving the signals REFRESHN high and the signal REFRESHP low. This couples the capacitor 476 to the capacitor 466 so that, given adequate time, the voltage across both capacitors will equalize to a level determined by the law of conservation of charge. Just as the transmission gate 450 is turned OFF so that capacitor 454 is isolated from signal PDRIVE_OUT, the transmission gate 470 is turned OFF so that capacitor node 472 is isolated from signal NDRIVE_OUT. Transistor 462 is then driven ON by the signal PBUF going low just as the transmission gate 470 is turned OFF to drive the gate of the transistor 468 to the supply voltage Vin. This takes place in time interval C. During time interval D, the voltage 308 on the signal PDRIVE_IN maintains transistor 468 in the ON state and transistor 408 in the OFF state. During time interval E, the transistor 408 turns ON and the transistor 468 turns OFF. Again, the signal REFRESHN is driven high and the signal REFRESHP is driven low to turn ON the transfer gates 470 and 450. At this time, parasitic capacitor 466 has a higher voltage on it than capacitor 476, so that charge flows from the parasitic capacitor to charge storage capacitor 476 until the voltages on both capacitors is equal. During interval F, the signal REFRESHN then goes low and the signal REFRESHP then goes high to isolate the capacitor node 472 from the signal NDRIVE_OUT so that the electrode 472 of capacitor 476 is floating. The signal NBUF then goes high, turning ON transistor 464 and pulling NDRIVE_OUT the remainder of the way to ground, thus turning transistor 468 OFF. At the same time, as described above, the signal PDRIVE_OUT drops from 312 to 314 during interval E and then to 320, thus turning ON transistor 408.

Figure 5:
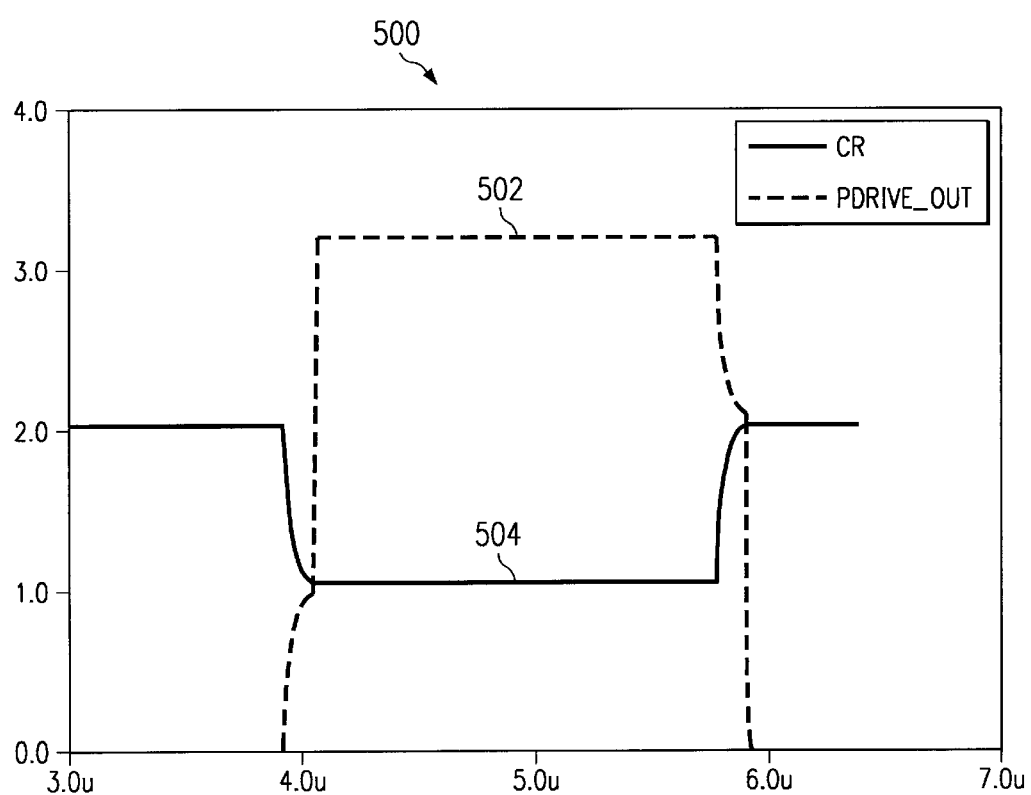
FIG. 5 is a simulation of the capacitor voltage CR and the signal PDRIVE_OUT of FIG. 2.

FIG. 5 is a computer simulation of the transient response of the signals CR and PDRIVE_OUT shown in FIG. 3. Waveform 502 applies shows the signal PDRIVE_OUT and wave form 504 show the signal CR. This figure allows one to calculate that the use of the present invention (Vin=3.2V and Cp=Cr=150pf allows the storage capacitor 254, 454 and 476 to store about 30% of the charge on power switching transistor gate capacitance. About 70% of the charge has to be delivered by Vin. Thus, this produces a savings of about 30% of the gate drive power. In a buck DC/DC switching regulator switching at 1MHz with a 150pF gate capacitance and a 200mA load, the gate drive losses will account for approximately 2% of the total power loss. The present invention will save about 30% of that 2%. However, under low load conditions, where the gate drive loss is one of the major power loss contributors, the savings will be higher. These low load conditions occur frequently in battery-powered equipment, such as cellular telephones, when the devices go into a low power rode often referred to as a "sleep" mode. In the "sleep" mode, the device is not OFF but is switched to a low power operation by powering down circuits that are not needed.

In regulators utilizing a synchronous rectifier, the losses of the DC/DC switching regulator can be made significantly smaller because of the much smaller voltage drop across the synchronous rectifier than the voltage drop across the diode. The diode voltage drop is the largest contributor to the losses in a non-synchronous regulator. The gate drive loss on each of the switching transistors, including the power switch and the synchronous rectifier, now accounts for approximately 8% of the total loss because the total loss is less than the loss described above using a diode rectifier. Thus the combined loss of these two devices accounts for approximately 16% of this reduced loss. The charge saving technique of the present invention can reduce this by about 30% depending on the voltage and the capacitance Cp and CR to produce a noticeable 4.8% improvement in efficiency. Under light loading conditions discussed above where the power losses from the parasitic resistances in the circuit are small, the gate drive loss can account for as much as half of the total loses, making the efficiency savings as high as 50% or possibly more.

While the invention has been particularly shown and described with reference to preferred embodiments thereof, it is well understood by those skilled in the art that various changes and modifications can be made in the invention without departing from the spirit and the scope of the invention as defined by the appended claims. For example, the present invention has been illustrated in connection with a buck switching regulator. Those skilled in the art will recognize that the same technique can be applied to a boost switching regulator such as shown in FIG. 1B, or to a buck/boost regulator. Furthermore, while the semiconductor switch is illustrated as a PMOS transistor and the synchronous rectifier is illustrated as a NMOS rectifier, those skilled in the art will recognize that transistors of the opposite type can be utilized with the present invention.

What is claimed is:

1. In a voltage converter comprising a semiconductor switch coupled to an inductor, a first capacitor and a rectifier, the semiconductor switch having a gate and being driven between ON and OFF states from first and second voltage sources by a control circuit, a circuit for improving switching efficiency of the semiconductor switch comprising:
    a second capacitor;
    a first transmission gate coupled between the second capacitor and the gate of the semiconductor switch, wherein the control circuit is coupled to the first transmission gate and generates a control signal to turn ON the first transmission gate when the control circuit isolates the semiconductor switch from the first and second voltage sources, turns OFF the first transmission gate before the control circuit drives the semiconductor switch to a second one of the ON and OFF states,turns on the first transmission gate after the first control circuit isolates the semiconductor switch from the first and second voltage sources and turns OFF the first transmission gate before driving the semiconductor switch from the second of the ON and OFF states, to the first of the ON and OFF states, whereby a portion of charge stored on a parasitic capacitance of the gate of the semiconductor switch is stored in the second capacitor and reused to partially drive the semiconductor switch from the first of the ON and OFF states to the second one of the ON and OFF states.

2. The circuit of claim 1 wherein the semiconductor switch is a PMOS transistor and the first one of the ON and OFF states is ON.

3. The circuit of claim 1 wherein the rectifier is a synchronous rectifier driven between ON and OFF states from third and fourth voltage sources, and further comprising a circuit for improving switching efficiency of the synchronous rectifier comprising a third capacitor;
    a second transmission gate coupled between the third capacitor and a gate of the synchronous rectifier;
    the control circuit being coupled to the second transmission gate to turn ON the second transmission gate when the control circuit isolates the synchronous rectifier from the third and fourth voltage sources, turn OFF the second transmission gate before the control circuit drives the synchronous rectifier to a first one of the ON and OFF states, turns on the first transmission gate after the first control circuit isolates the synchronous rectifier from the third and fourth voltage sources and turns OFF the second transmission gate before driving the synchronous rectifier from the first of the ON and OFF states to the second of the ON and OFF states, whereby a portion of charge stored on a parasitic capacitance of the gate of the synchronous rectifier is stored in the third capacitor and reused to partially drive the synchronous rectifier from the second of the ON and OFF states to the first one of the ON and OFF states.

4. The circuit of claim 3 wherein the semiconductor switch is an NMOS transistor and the first one of the ON and OFF states is ON and wherein the first and third voltage sources are at the same potential and the second and fourth voltage sources are at the same potential.

5. The circuit of claim 1 wherein the voltage converter is a buck circuit for generating an output voltage which is lower than an input voltage.

6. The circuit of claim 3 wherein the voltage converter is a buck circuit for generating an output voltage which is lower than an input voltage.

7. A DC to DC converter for generating a voltage at an, output which is lower than a voltage supplied at an input comprising:
    a PMOS transistor coupled between the voltage supply and the series connection of an inductor and a capacitor, voltage across the capacitor being the output voltage;
    a rectifier connected in parallel to the series connected inductor and capacitor;
    a control circuit for the PMOS transistor coupled to a gate thereof and providing a drive signal between substantially the supply voltage and substantially a reference voltage;
    a transmission gate coupled between the gate, a second capacitor and the reference voltage and responsive to a control voltage generated by the control circuit for driving the transmission gate ON after the gate of the PMOS transistor is isolated from the supply voltage and the reference voltage, driving the transmission gate OFF after a predetermined time interval and before the control circuit drives the gate of the PMOS transistor to substantially the supply voltage, the control circuit isolating the gate of the PMOS transistor before driving the transmission gate ON for a predetermined time interval before the drive signal at substantially the reference voltage is applied to the gate of the PMOS transistor.

8. A method for operating a voltage converter having a semiconductor switch coupled to an inductor, a first capacitor, and a rectifier, the semiconductor switch being driven between ON and OFF states from first and second voltage sources and having parasitic capacitance at a gate thereof, comprising:

isolating the semiconductor switch from the first and second voltage sources;

transferring charge from the parasitic capacitance to a second capacitor coupled thereto;

terminating the charge transfer and isolating the second capacitor from a remainder of the voltage converter;

changing an ON/OFF state of the semiconductor switch by driving the gate to the other of the first and second voltage sources;

isolating the semiconductor switch from the first and second voltage sources;

coupling the second capacitor to the gate to charge the parasitic capacitance prior to isolating the second capacitor from a remainder of the voltage converter and driving the semiconductor switch to the other of the ON/OFF states;

driving the semiconductor switch to the other of the ON/OFF states.

9. Method of claim 8 wherein the voltage converter generates voltage at an output which is lower than an input voltage.

10. Method of claim 8 wherein the semiconductor switch is a PMOS transistor and the ON/OFF state which is changed is from OFF to ON.

11. Method of claim 8 wherein the rectifier is a synchronous rectifier driven between ON and OFF states from third and fourth voltage sources and having parasitic capacitance at a gate thereof and further comprising a method for improving the switching efficiency of the synchronous rectifier comprising:

isolating the synchronous rectifier from the third and fourth voltage sources;

transferring charge from the parasitic capacitance of the synchronous rectifier to a third capacitor coupled thereto;

terminating the charge transfer and isolating the third capacitor from a remainder of the voltage converter;

changing an ON/OFF state of the synchronous rectifier by driving the gate thereof to a voltage supply;

isolating the synchronous rectifier from the third and fourth voltage sources;

coupling the third capacitor to the gate to charge the parasitic capacitance prior to isolating the second capacitor from a remainder of the voltage converter and driving the synchronous rectifier to the other of the ON/OFF states;

driving the synchronous rectifier to the other of the ON/OFF states.

12. Method of claim 11 wherein the semiconductor switch is a NMOS transistor and the ON/OFF state which is changed is from ON to OFF and the first and fourth voltage sources are at the same potential and the second and third voltage sources are at the same potential.

13. Method of claim 11 wherein the voltage converter generates voltage at an output which is lower than an input voltage.

14. Method of claim 11 wherein the synchronous rectifier is a NMOS transistor and the ON/OFF state which is changed is from ON to OFF and the first and fourth voltage sources are at the same potential and the second and third voltage sources are at the same potential.

15. A cellular telephone comprising:

a voltage converter for powering a telephone circuit, the voltage converter comprising a semiconductor switch coupled to an inductor, a first capacitor and a rectifier, the semiconductor switch having a gate and being driven between ON and OFF states from first and second voltage sources by a first control circuit;

a second capacitor;

a first transmission gate coupled between the second capacitor and the gate of the semiconductor switch, wherein the first control circuit is coupled to the first transmission gate and generates a control signal to turn ON the first transmission gate when the first control circuit isolates the semiconductor switch from the first and second voltage sources, turns OFF the first transmission gate before the control circuit drives the semiconductor switch to a second one of the ON and OFF states, turns on the first transmission gate after the first control circuit isolates the semiconductor switch from the first and second voltage sources and turns OFF the first transmission gate before driving the semiconductor switch from the second of the ON and OFF states to the first of the ON and OFF states, whereby a portion of the charge stored on a parasitic capacitance of the gate of the semiconductor switch is stored in the second capacitor and reused to partially drive the semiconductor switch from the first of the ON and OFF states to the second one of the ON and OFF states.

16. The cellular telephone of claim 15 wherein the semiconductor switch is a PMOS transistor and the first one of the ON and OFF states is ON.

17. The cellular telephone of claim 15 wherein the rectifier is a synchronous rectifier driven between ON and OFF states from third and fourth voltage sources and further comprising a circuit for improving switching efficiency of the synchronous rectifier comprising:

a third capacitor, the transmission gate coupled between the third capacitor and a gate of the synchronous rectifier;

the control circuit being coupled to the second transmission gate to turn ON the second transmission gate when the second control circuit isolates the synchronous rectifier from the third and fourth voltage sources, turns OFF the second transmission gate before the control circuit drives the synchronous rectifier to a first one of the ON and OFF states, turns on the first transmission gate after the first control circuit isolates the synchronous rectifier from the third and fourth voltage sources and turns OFF the second transmission gate before driving the synchronous rectifier from the first of the ON and OFF states to the second of the ON and OFF states, whereby a portion of charge stored on a parasitic capacitance of the gate of the synchronous rectifier is stored in the third capacitor and reused to partially drive the synchronous rectifier from the second of the ON and OFF states to the first one of the ON and OFF states.

18. The cellular telephone of claim 17 wherein the synchronous rectifier switch is an NMOS transistor and the first one of the ON and OFF states is ON and wherein the first and third voltage sources are at the same potential and the second and fourth voltage sources are at the same potential.

19. The cellular telephone of claim 15 wherein the voltage converter is a buck circuit for generating an output voltage which is lower than an input voltage.

20. The cellular telephone of claim 17 wherein the voltage converter is a buck circuit for generating an output voltage which is lower then an input voltage.

\* \* \* \* \*